United States Patent
Shibata

(10) Patent No.: US 7,285,462 B2
(45) Date of Patent: Oct. 23, 2007

(54) SEMICONDUCTOR MEMORY DEVICE WITH TRENCH-TYPE STACKED CELL CAPACITORS AND METHOD FOR MANUFACTURING THE SAME

(75) Inventor: Yoshiyuki Shibata, Shiga (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 11/650,126

(22) Filed: Jan. 5, 2007

(65) Prior Publication Data

US 2007/0114588 A1    May 24, 2007

Related U.S. Application Data

(62) Division of application No. 10/756,961, filed on Jan. 13, 2004, now Pat. No. 7,189,616, which is a division of application No. 10/057,658, filed on Jan. 23, 2002, now Pat. No. 6,710,389.

(30) Foreign Application Priority Data

Feb. 9, 2001    (JP)    ............................. 2001-033445

(51) Int. Cl.
H01L 21/8242    (2006.01)
(52) U.S. Cl. ................. 438/253; 438/396; 438/E21.648
(58) Field of Classification Search ........ 438/243–244, 438/253, 386–387, 396–398, E21.648
See application file for complete search history.

(56) References Cited

U.S. PATENT DOCUMENTS

| | | |
|---|---|---|
| 5,604,696 A | 2/1997 | Takaishi |
| 5,877,522 A | 3/1999 | Kasai |
| 6,097,055 A | 8/2000 | Lee et al. |
| 6,177,309 B1 | 1/2001 | Lee |
| 6,222,217 B1 | 4/2001 | Kunikiyo |
| 6,331,480 B1 | 12/2001 | Tsai et al. |
| 6,380,575 B1 | 4/2002 | Radens |
| 6,381,165 B1 | 4/2002 | Lee et al. |

(Continued)

FOREIGN PATENT DOCUMENTS

JP    6-310671    11/1994

(Continued)

*Primary Examiner*—Hoai Pham
(74) *Attorney, Agent, or Firm*—Hamre, Schumann, Mueller & Larson, P.C.

(57) ABSTRACT

A DRAM is provided that can reduce the parasitic capacitance between trench-type stacked cell capacitors in a memory cell region and suppress malfunction caused by noise. The trench-type stacked cell includes a number of capacitors having the same shape. The capacitors are formed in such a manner that storage nodes, a capacitor insulating film, and a plate electrode are buried in each of a plurality of trenches of an interlayer insulating film. The cell layout can be as follows: the capacitors are arranged so that only a part of a side face of one trench is opposite to that of the other; the capacitors are arranged so that the side face of one trench is opposite completely to that of the other and the distance between the opposing side faces is larger at the central portions of the respective trenches; or the cell is arranged so that the plate electrode is buried in a concavity between the cell capacitors.

4 Claims, 12 Drawing Sheets

U.S. PATENT DOCUMENTS

| | | |
|---|---|---|
| 6,429,475 B1 | 8/2002 | Clampitt |
| 6,451,661 B1 * | 9/2002 | DeBoer et al. ............ 438/386 |
| 6,617,631 B2 | 9/2003 | Huang |
| 6,737,696 B1 | 5/2004 | DeBoer et al. |

FOREIGN PATENT DOCUMENTS

| | | |
|---|---|---|
| JP | 8-46152 | 2/1996 |
| JP | 8-70100 | 3/1996 |
| JP | 9-8242 | 1/1997 |
| JP | 9-283719 | 10/1997 |
| JP | 10-79478 | 3/1998 |
| JP | 10-93049 | 4/1998 |
| JP | 10-98168 | 4/1998 |
| JP | 11-163329 | 6/1999 |
| JP | 11-297960 | 10/1999 |
| JP | 2000-12808 | 1/2000 |
| JP | 2000-164545 | 6/2000 |
| JP | 2000-174227 | 6/2000 |
| JP | 2001-24169 | 1/2001 |

* cited by examiner

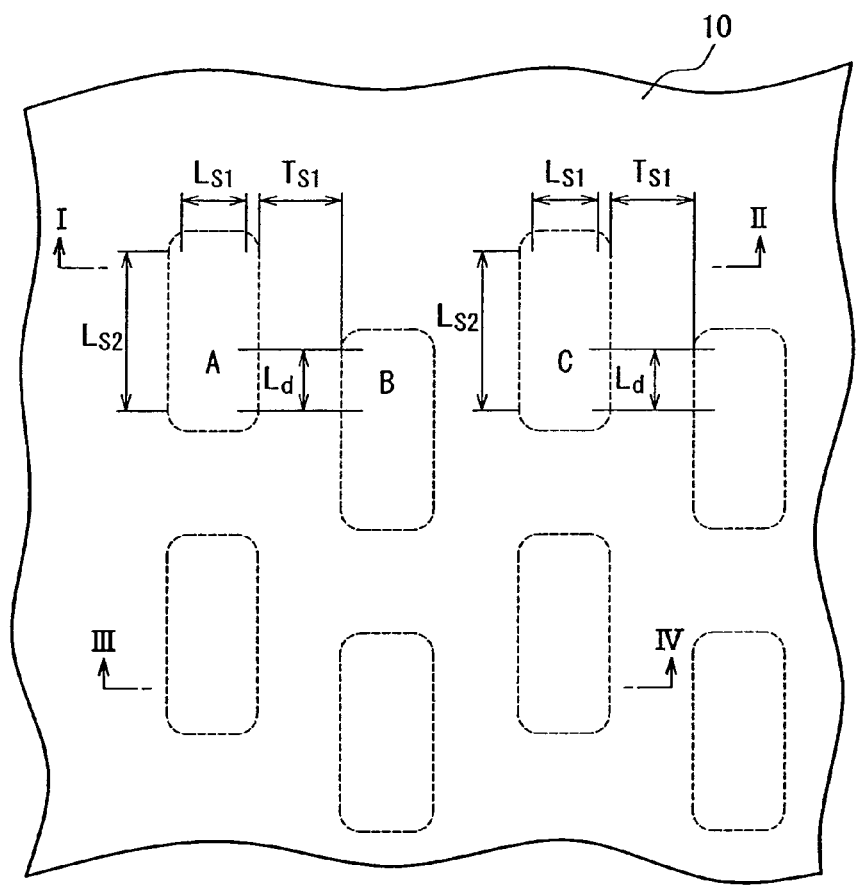
F I G. 1
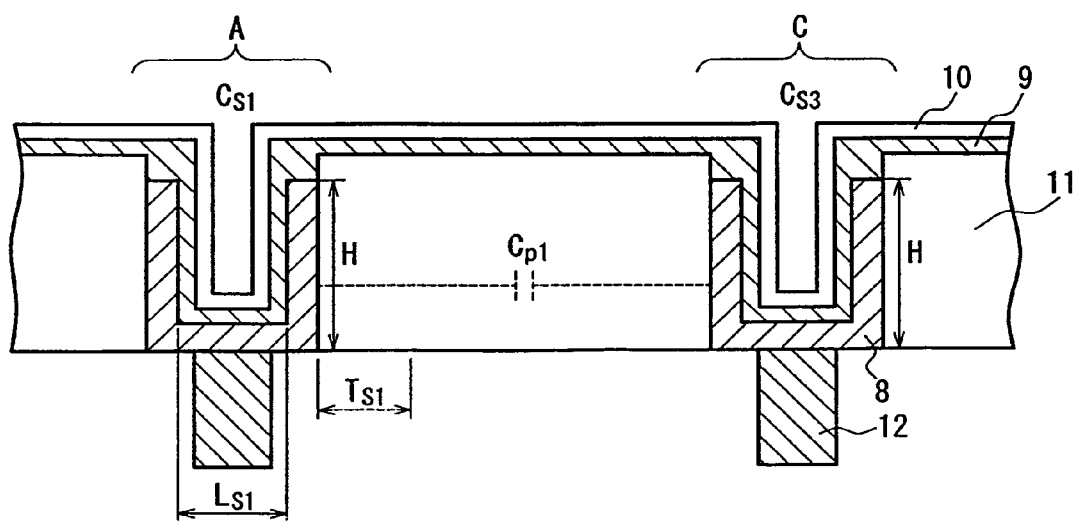
F I G. 2

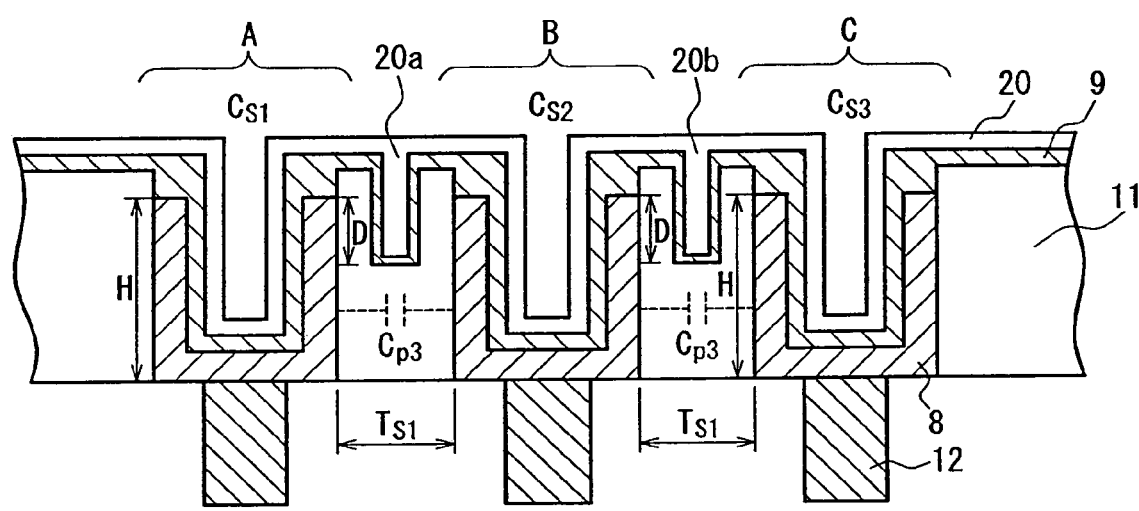
F I G. 5

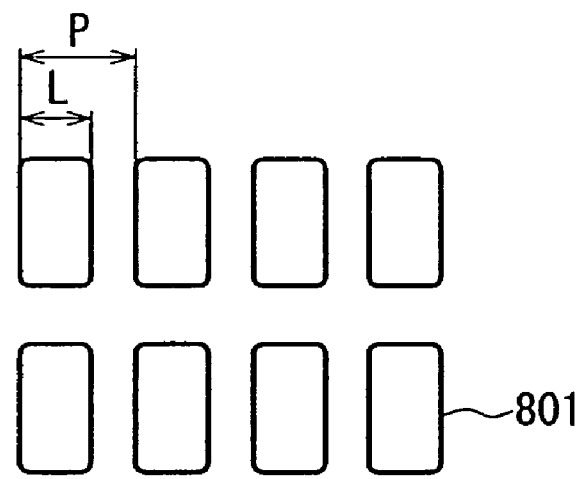
F I G. 8
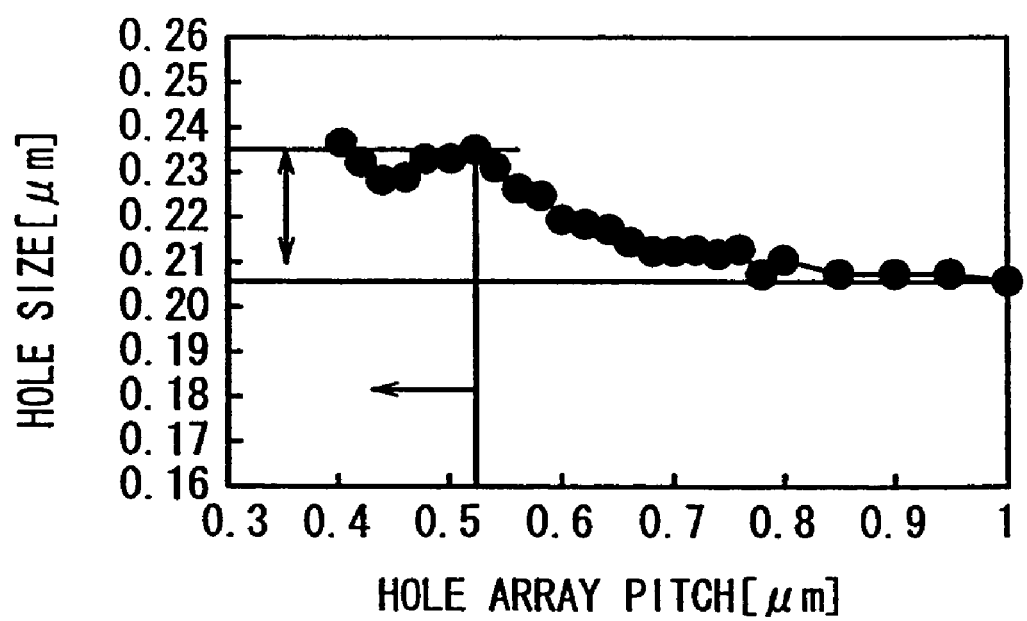
F I G. 9

SEMICONDUCTOR MEMORY DEVICE WITH TRENCH-TYPE STACKED CELL CAPACITORS AND METHOD FOR MANUFACTURING THE SAME

This application is a division of U.S. Ser. No. 10/756,961, filed Jan. 13, 2004, now U.S. Pat. No. 7,189,616 which is a division of U.S. Ser. No. 10/057,658, filed Jan. 23, 2002, now U.S. Pat. No. 6,710,389 which applications are incorporated herein by reference.

BACKGROUND OF THE INVENTION

1. Field of the Invention

The present invention relates to a semiconductor memory device, in particular, a dynamic random access memory (i.e., DRAM) whose memory cell portion has a trench-type stacked cell structure. More specifically, the present invention relates to a semiconductor memory device including a storage capacity element portion that is suitable for a highly integrated device and has high reliability, and to a method for manufacturing the semiconductor memory device.

2. Description of the Related Art

With the implementation of a smaller-scale device and a larger-capacity DRAM in recent years, the surface area occupied by a single memory cell on a chip of a semiconductor memory device is reduced increasingly.

FIG. 11 is a plan view schematically showing the layout of trench-type stacked cell capacitors (i.e., concave-type capacitors) formed in a memory cell region. In FIG. 11, reference numeral 110 denotes a cell plate electrode, $L_{S1}$ denotes the short side length of a cell capacitor, $Ls_2$ denotes the long side length of the cell capacitor, and $Ts_1$ denotes the distance between the adjacent cell capacitors.

FIG. 12 is a cross-sectional view taken along the line I-II in FIG. 11. FIG. 12 illustrates a cell capacitor A (with a capacitance of $C_{S1}$), a cell capacitor B (with a capacitance of $C_{S2}$) and a cell capacitor C (with a capacitance of $C_{S3}$), which are adjacent to one another. Each of the cell capacitors is a trench-type stacked cell, i.e., the cell capacitor region is recessed, and the plate electrode 110 is exposed on the entire surface. Here, H represents the height of the cell capacitor. These cell capacitors are connected to transfer transistors so as to form a storage capacity element portion (i.e., a DRAM circuit), as shown in FIG. 13. In FIG. 13, WL1, WL2 and WL3 are word lines, and $C_p$, is a parasitic capacitance formed between the cell capacitors. The parasitic capacitance $C_p$ will be described later.

The following is an explanation of the structure shown in FIG. 12. An interlayer insulating film 111 is deposited on the region where memory cells are formed. The interlayer insulating film 111 has holes for providing storage nodes (i.e., lower electrodes of the memory cells), and conductive films 108a, 108b and 108c that act as the storage nodes are formed in the holes. Each of the storage nodes is connected to a plug 112 via a barrier metal (not shown). A capacitor insulating film 109 and the plate electrode 110 are deposited on the entire surface, including the insides of the holes where the storage nodes have been formed, without removing the interlayer insulating film 111. In other words, the trench-type stacked cell structure is a cell structure that utilizes only the inner surfaces of the trenches defined by the interlayer insulating film 111 as capacitors.

FIG. 14 is a cross-sectional view showing the structure of conventional simple-stacked memory cells. In FIG. 14, capacitor insulating films 102, and thereon a plate electrode 103 are formed so as to cover cylindrical storage nodes 101.

FIG. 15 is a cross-sectional view showing the structure of conventional cylindrical cell capacitors. In FIG. 15, capacitor insulating films 105, and thereon a plate electrode 106 are formed so as to cover the inner and outer surfaces of cylindrical storage nodes 104.

FIGS. 16A to 16E are cross-sectional views showing the manufacturing steps of conventional cylindrical cell capacitors. First, as shown in FIG. 16A, transfer gate MOS transistors 1603 are formed on a semiconductor substrate (not shown), on which a first interlayer insulating film 1601 is deposited, and then contact plugs 1602 are formed. Next, as shown in FIG. 16B, a second interlayer insulating flm 1604 is deposited. After deposition of a resist, a hole pattern for storage nodes is formed by photolithography. Using the hole pattern as a mask, holes 1605 for storage nodes are formed in the second interlayer insulating film 1604 by anisotropic dry etching, as shown in FIG. 16C. After formation of the contact holes, a film for forming storage nodes, e.g., a silicon film is deposited. The silicon film on the second interlayer insulating film 1604 is removed selectively by dry etching or the like, so that the silicon films having a cylindrical shape are left only in the holes 1605, which serves as cylindrical storage nodes 1606. Then, the second interlayer insulating film 1604 is removed selectively, e.g., by wet etching, thus leaving the cylindrical storage nodes 1606 on the first interlayer insulating film 1601, as shown in FIG. 16D. Finally, as shown in FIG. 16E, capacitor insulating films 1607 are formed, followed by a plate electrode 1608, resulting in memory cell capacitors.

For the structures shown in FIGS. 14, 15 and 16E, the adjacent cell capacitors are connected electrically by the plate electrodes 103, 106 and 1608, respectively, each of which has the same electric potential. Therefore, a large parasitic capacitance is not generated between the adjacent cell capacitors even if the plate electrode is covered with an interlayer insulating film (not shown).

FIGS. 17A to 17E are cross-sectional views showing the manufacturing steps of the conventional trench-type stacked cell structure described above. The flow of the steps shown in FIGS. 17A, 17B and 17C is the same as that in FIGS. 16A, 16B and 16C, i.e., the steps of forming transfer gate MOS transistors 1703, depositing a first interlayer insulating film 1701, forming contact plugs 1702, depositing a second interlayer insulating film 1704, and forming holes 1705 for storage nodes in the second interlayer insulating film 1704 by lithography and dry etching. After these steps, cylindrical storage nodes 1706 are formed, as shown in FIG. 17D. Then, a capacitor insulating film 1707, and thereon a plate electrode 1708 are formed without removing the second interlayer insulating film 1704, as shown in FIG. 17E.

The above method for manufacturing the trench-type stacked cell structure eliminates the step of removing the second interlayer insulating film 1704 around the storage nodes and can proceed to the next step. Therefore, the manufacturing steps can be shortened and nonuniformity in the pattern of the cylindrical storage nodes 1706 can be suppressed as well. Moreover, unlike the structures shown in FIGS. 14 and 15, it is not necessary to estimate a margin between cell capacitors when the cell capacitor pattern is formed by lithography and dry etching. Thus, this method is very effective in scaling down the device. A large-capacity DRAM can be achieved by arranging a number of small trench-type stacked cells that are produced in such a simple process as described above.

In view of this, the trench-type stacked cell structures shown in FIGS. 12 and 17E are expected to be used as the capacitor structure of memory cells in a future DRAM.

In the trench-type stacked cell structure, though the storage nodes (i.e., the lower electrodes) of the individual cell capacitors are separated electrically and have different potentials, an interlayer insulating film is interposed between the adjacent cell capacitors. Therefore, the trench-type stacked cell structure may cause a problem that a larger parasitic capacitance is generated easily compared with other cell capacitor structures, even if the distance between adjacent cell capacitors in the trench-type stacked cell structure is the same as that in the other structures.

For instance, in the example shown in FIG. 12, the interlayer insulating films 111 are interposed between the storage node 108a of the cell capacitor A and the storage node 108b of the cell capacitor B and between the storage node 108b and the storage node 108c of the cell capacitor C. Thus, a parasitic capacitance $C_{p4}$ is generated between each of the cell capacitors so as to make a connection between them, as indicated by the broken line ($C_p$) in FIG. 13.

When one of the adjacent memory cell capacitors A and B, e.g., the capacitor A is in the charge storage state (logic "1") and the other memory cell capacitor, e.g., the capacitor B is in the discharge state (logic "0"), the parasitic capacitance $C_p$ has the following effect on both capacitors. With an increase in the parasitic capacitance $C_p$, the potential of the capacitor B in the discharge state is increased as a result of being affected by the potential of the capacitor A in the charge storage state, while the potential of the capacitor A is decreased as a result of being affected by the potential of the capacitor B.

When reading is performed after charge has been retained in the above condition, information that has been originally in the discharge or charge storage state exceeds the threshold voltage for discriminating between the two states. Consequently, the cell capacitor in its discharge state is recognized as to be in the charge storage state or the cell capacitor in its charge storage state is recognized as to be in the discharge state. Thus, the information is detected as an error signal, which prevents normal operation of the memory.

SUMMARY OF THE INVENTION

Therefore, with the foregoing in mind, it is an object of the present invention to provide a semiconductor memory device that can reduce the parasitic capacitance between trench-type stacked cell capacitors in a DRAM memory cell region and suppress malfunction caused by noise, and a method for manufacturing the semiconductor memory device.

A first semiconductor memory device of the present invention includes a storage capacity element portion including a plurality of capacitors that constitute memory cells and have the same shape. An interlayer insulating film has a plurality of trenches in which storage nodes are buried separately and a capacitor insulating film and a plate electrode are buried in common so as to form the capacitors. Any capacitor is arranged so that only a part of a side face of one trench is opposite to that of the other.

In the configuration of the first semiconductor memory device, the side face of one capacitor is not opposite completely to that of the other, unlike the conventional trench-type stacked cell capacitors. Therefore, the parasitic capacitance between adjacent cell capacitors can be reduced.

A second semiconductor memory device of the present invention includes a storage capacity element portion including a plurality of capacitors that constitute memory cells and have the same shape. An interlayer insulating film has a plurality of trenches in which storage nodes are buried separately and a capacitor insulating film and a plate electrode are buried in common so as to form the capacitors. Any capacitor is arranged so that a side face of one trench is opposite completely to that of the other, and has a shape in which the distance between the opposing side faces is larger at the central portions of the respective trenches.

In the configuration of the second semiconductor memory device, the distance between the opposing side faces of the capacitors is not constant but is increased partially. Therefore, the parasitic capacitance between adjacent cell capacitors can be reduced, even if the side face of one capacitor is opposite completely to that of the other.

A third semiconductor memory device of the present invention includes a storage capacity element portion including a plurality of capacitors that constitute memory cells and have the same shape. An interlayer insulating film has a plurality of trenches in which storage nodes are buried separately and a capacitor insulating film and a plate electrode are buried in common so as to form the capacitors. A concavity is provided between the adjacent capacitors and the plate electrode is buried in the concavity.

In the configuration of the third semiconductor memory device, the potential is fixed by the plate electrode in common in the region where the storage nodes of adjacent capacitors are buried. Therefore, the parasitic capacitance is not generated in the region where the plate electrode is buried, so that the parasitic capacitance between the adjacent cell capacitors can be reduced.

A first method for manufacturing a semiconductor memory device of the present invention includes the following steps: depositing an interlayer insulating film on a semiconductor substrate provided with contact plugs; patterning a mask pattern on the interlayer insulating film, the mask pattern having a layout in which a plurality of hole patterns having the same shape are arranged so that the adjacent hole patterns are only partially opposite to each other; forming holes for storage nodes in the interlayer insulating film by etching with the mask pattern; forming the storage nodes in the holes so as to be connected electrically to the contact plugs; forming a capacitor insulating film on the storage nodes; and forming a plate electrode on the capacitor insulating film.

According to the first manufacturing method, the first semiconductor memory device having the above characteristics can be produced.

A second method for manufacturing a semiconductor memory device of the present invention includes the following steps: depositing an interlayer insulating film on a semiconductor substrate provided with contact plugs; patterning a mask pattern on the interlayer insulating film, the mask pattern having a layout in which a plurality of hole patterns having the same shape are arranged so that the adjacent hole patterns are opposite to each other, and the distance between the opposing hole patterns is larger at the central portions of the respective hole patterns; forming holes for storage nodes in the interlayer insulating film by etching with the mask pattern; forming the storage nodes in the holes so as to be connected electrically to the contact plugs; forming a capacitor insulating film on the storage nodes; and forming a plate electrode on the capacitor insulating film.

According to the second manufacturing method, the second semiconductor memory device having the above characteristics can be produced.

A third method for manufacturing a semiconductor memory device of the present invention includes the following steps: depositing an interlayer insulating film on a semiconductor substrate provided with contact plugs; patterning a mask pattern on the interlayer insulating film, the mask pattern having a layout in which a plurality of hole patterns having the same shape are arranged so that the adjacent hole patterns are opposite to each other; forming holes for storage nodes in the interlayer insulating film by etching with the mask pattern; forming the storage nodes in the holes so as to be connected electrically to the contact plugs; forming a capacitor insulating film on the storage nodes; and forming a plate electrode on the capacitor insulating film. The mask pattern is patterned with a pitch of the hole patterns that makes the distance between the opposing central portions of the adjacent storage nodes larger than the distance between the opposing corners thereof due to the proximity effect during formation of the storage nodes. In such a case, it is preferable that the pitch is smaller than 0.55 μm.

According to the third manufacturing method, the second semiconductor memory device having the above characteristics can be produced by actively utilizing the proximity effect during formation of the storage nodes, even when employing the same mask pattern as that of a conventional example.

A fourth method for manufacturing a semiconductor memory device of the present invention includes the following steps: depositing an interlayer insulating film on a semiconductor substrate provided with contact plugs; patterning a mask pattern on the interlayer insulating film, the mask pattern having a layout in which a plurality of hole patterns having the same shape are arranged so that the adjacent hole patterns are opposite to each other; forming holes for storage nodes in the interlayer insulating film by etching with the mask pattern; forming the storage nodes in the holes so as to be connected electrically to the contact plugs; etching the upper portion of the interlayer insulating film between the storage nodes; forming a capacitor insulating film on the storage nodes; and forming a plate electrode on the capacitor insulating film.

According to the fourth manufacturing method, the third semiconductor memory device having the above characteristics can be produced.

In the first to third semiconductor memory devices and the first to fourth manufacturing methods, it is preferable that the relative dielectric constant of the interlayer insulating film is smaller than that of a silicon oxide film. The use of a low dielectric constant film as the interlayer insulating film can further reduce the parasitic capacitance between adjacent capacitors.

BRIEF DESCRIPTION OF THE DRAWINGS

FIG. 2 is a cross-sectional view showing the structure of the cell capacitors, taken along the line I-II in FIG. 1.

FIG. 5 is a cross-sectional view showing the structure of cell capacitors in a semiconductor memory device of a third embodiment of the present invention.

FIG. 8 is a plan view showing the layout of a mask pattern for storage nodes in a modified example according to the method of the fifth embodiment of the present invention.

FIG. 9 is a graph showing a hole size in the corner of a pattern resulting from proximity effect versus a hole array pitch P when using the mask pattern in FIG. 8.

FIG. 14 is a cross-sectional view showing the structure of conventional simple-stacked memory cells.

FIG. 15 is a cross-sectional view showing the structure of conventional cylindrical cell capacitors.

DESCRIPTION OF THE PREFERRED EMBODIMENTS

Hereinafter, preferred embodiments of the present invention will be described with reference to the accompanying drawings.

First Embodiment

A first embodiment of the present invention devices the arrangement (i.e., the layout) of memory cells in a cell capacitor array to reduce the parasitic capacitance between adjacent cell capacitors.

Figure 1:
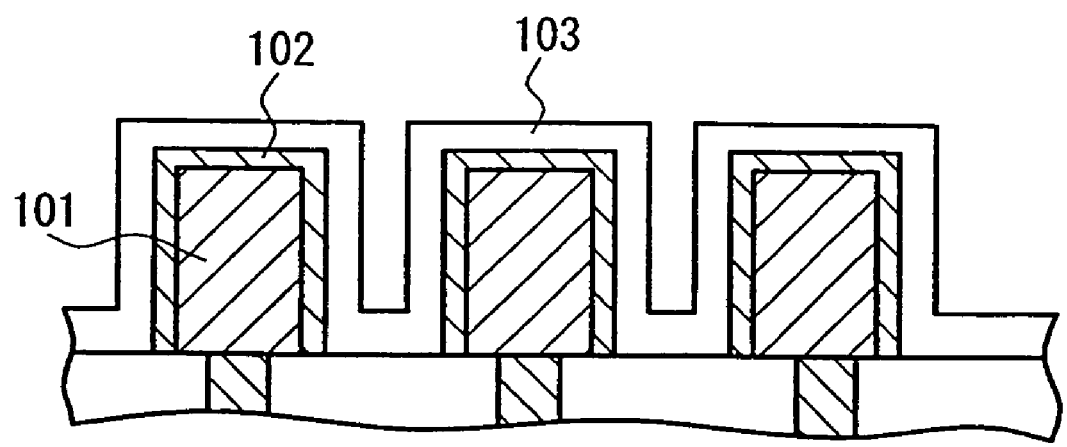
FIG. 1 is a plan view schematically showing the layout of cell capacitors in a semiconductor memory device of a first embodiment of the present invention.
Figure 1:
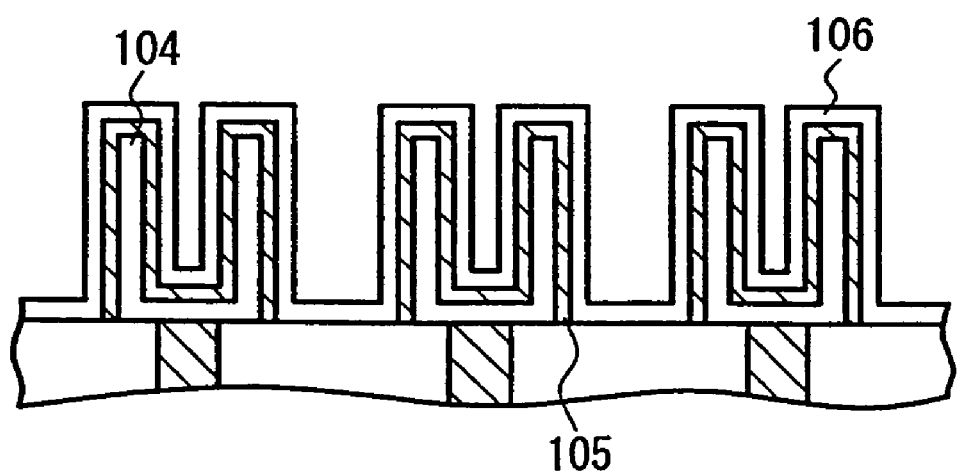
Figure 16A:
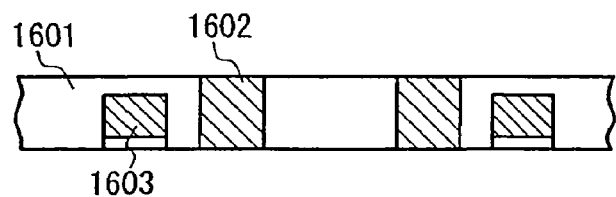
FIG. 16A is a cross-sectional view showing a step of manufacturing conventional cylindrical cell capacitors.
Figure 16B:
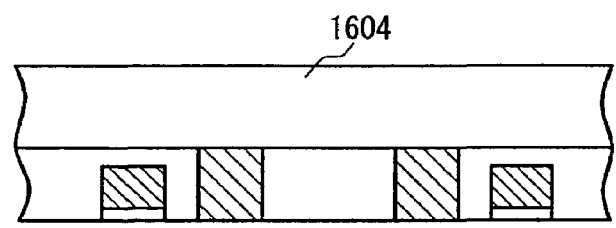
FIG. 16B is a cross-sectional view showing a step of manufacturing the conventional cylindrical cell capacitors.
Figure 16C:
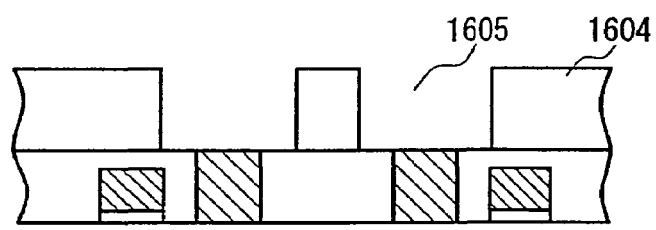
FIG. 16C is a cross-sectional view showing a step of manufacturing the conventional cylindrical cell capacitors.
Figure 16D:
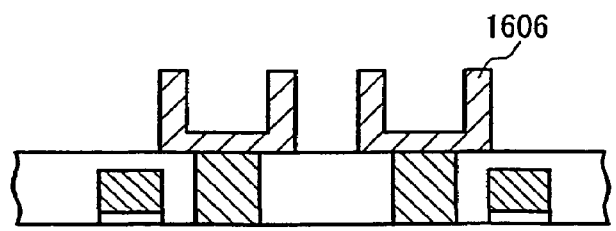
FIG. 16D is a cross-sectional view showing a step of manufacturing the conventional cylindrical cell capacitors.
Figure 16E:
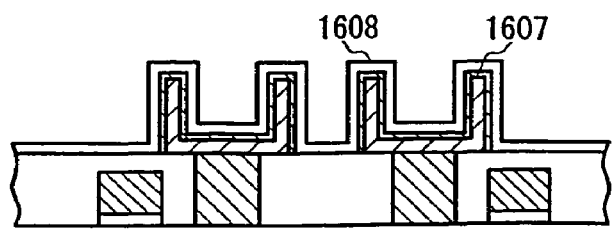
FIG. 16E is a cross-sectional view showing a step of manufacturing the conventional cylindrical cell capacitors.
Figure 17A:
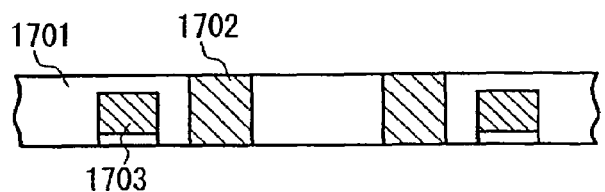
FIG. 17A is a cross-sectional view showing a step of manufacturing conventional trench-type cell capacitors.
Figure 17B:
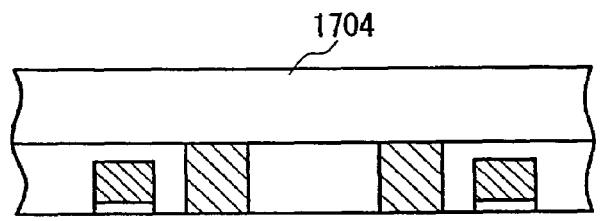
FIG. 17B is a cross-sectional view showing a step of manufacturing the conventional trench-type cell capacitors.
Figure 17C:
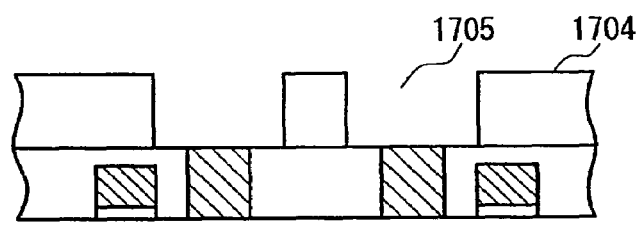
FIG. 17C is a cross-sectional view showing a step of manufacturing the conventional trench-type cell capacitors.
Figure 17D:
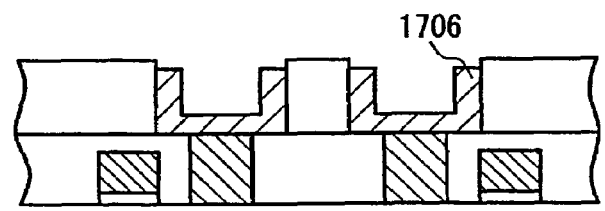
FIG. 17D is a cross-sectional view showing a step of manufacturing the conventional trench-type cell capacitors.
Figure 17E:
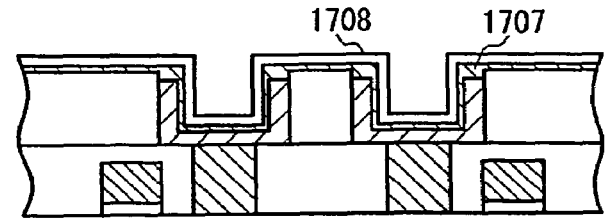
FIG. 17E is a cross-sectional view showing a step of manufacturing the conventional trench-type cell capacitors.

FIG. 1 is a plan view schematically showing the layout of cell capacitors in a storage capacity element portion of a semiconductor memory device according to the first embodiment of the present invention. In FIG. 1, reference numeral 10 denotes a plate electrode, $L_{s1}$ denotes the short side length of a cell capacitor, $L_{s2}$ denotes the long side length of the cell capacitor, $T_{s1}$ denotes the distance between the adjacent cell capacitors, and $L_d$ denotes the length of a portion where the opposing cell capacitors are overlapped. The shape of each of cell capacitors A, B and C is indicated by a broken line. In general, the shape is rectangular (square) when patterned by lithography. However, the actual cell capacitor has four rounded corners due to etching or the like, and finally is in the form of a rectangle with four rounded corners, such as a cell shown in FIG. 1, or close to an ellipse.

Unlike a conventional layout in which the adjacent cell capacitors are opposite completely to each other, this embodiment is characterized by a layout in which the adjacent cell capacitors are staggered so that only a part of a side face of one cell capacitor is opposite to that of the other.

FIG. 2 is a cross-sectional view showing the structure of the cell capacitors, taken along the line I-II in FIG. 1. In FIG. 2, reference numeral 11 denotes an interlayer insulating film, 8 denotes storage nodes, 9 denotes a capacitor insulating film, 10 denotes a plate electrode, and 12 denotes plugs. Referring to FIG. 2, only the cell capacitors A and C are illustrated, and the cell capacitor B that should be located between them is not described. However, the cell capacitor B will be present in the cross-sectional view taken along the line III-IV in FIG. 1, like the conventional example shown in FIG. 12.

An aspect of this embodiment is modification in the layout of cell capacitors. While the opposing side faces of adjacent cell capacitors are opposite completely to each other in the conventional layout, this embodiment allows only a part of a side face of one cell capacitor to be opposite to that of the other. This layout can provide at least a cross section of the cell array that does not include a cell capacitor that would have been present as one of the adjacent cell capacitors in the conventional layout. Thus, the parasitic capacitance between the adjacent cell capacitors can be reduced.

Here, using numerical examples, a parasitic capacitance value obtained by the cell layout of this embodiment is compared with that obtained by the conventional cell layout.

Figure 11:
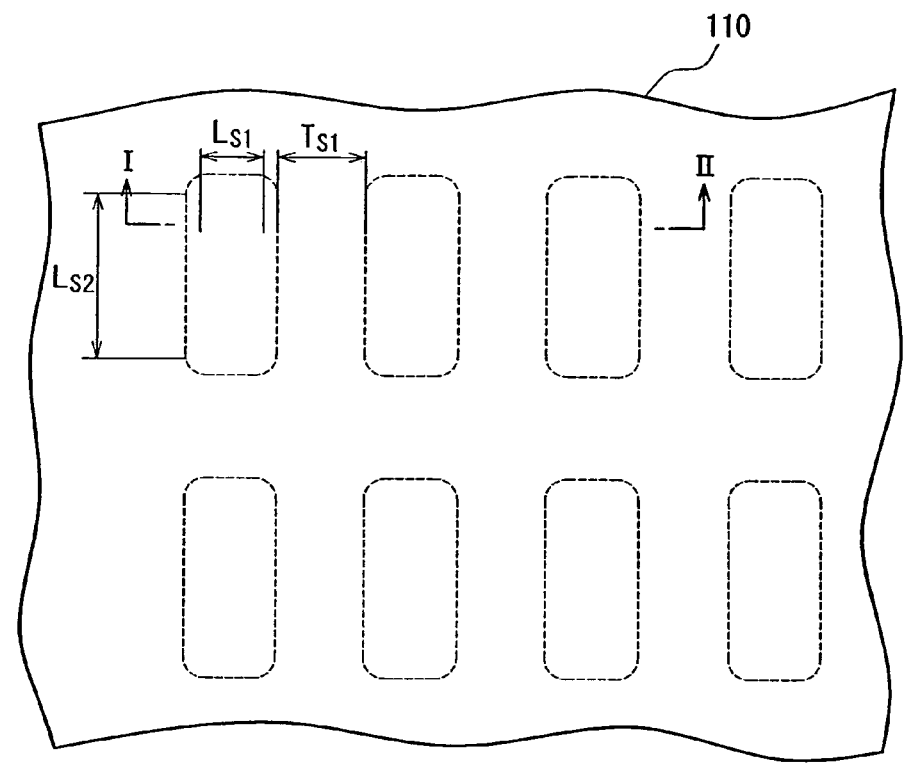
FIG. 11 is a plan view schematically showing the layout of trench-type stacked cell capacitors in a conventional semiconductor memory device.
Figure 12:
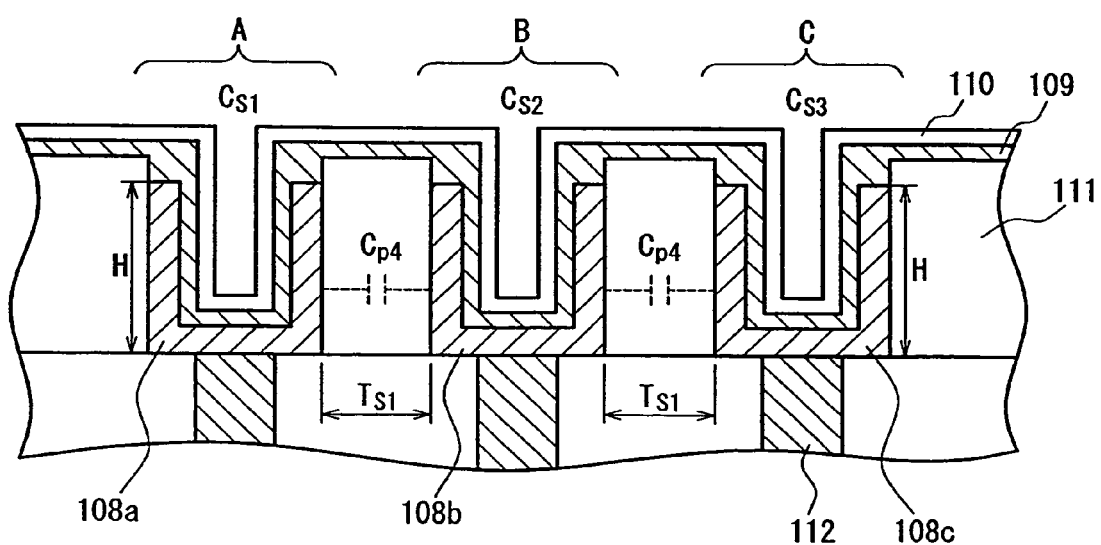
FIG. 12 is a cross-sectional view showing the structure of the cell capacitors, taken along the line I-II in FIG. 11.

First, the parasitic capacitance value in the conventional layout is estimated with reference to FIGS. 11 and 12. FIG. 11 shows the planar layout of a conventional memory cell capacitor array, and FIG. 12 is a cross-sectional view showing the structure thereof. It should be noted that the following values are only an example for explaining the effects of the present invention and those values may be changed appropriately as needed.

A set cell capacitance value is expressed by $$C_{s1} = \epsilon_0 \times \epsilon_2 \times 2 \times (L_{s1} + L_{s2}) \times H \div d \qquad \text{Eq. (1)}$$

where $\epsilon_0$ is a dielectric constant in vacuum, $L_{s1}$ is the short side length of a cell capacitor, $L_{s2}$ is the long side length of the cell capacitor, H is the height of the cell capacitor, d is the thickness of a capacitor insulating film (i.e., the thickness converted to a silicon oxide film), and $\epsilon_2$ is a relative dielectric constant of the silicon oxide film. With the substitution of $\epsilon_0 = 8.854 \times 10^{-12}$ F/m, $L_{s1} = 0.15$ μm, $L_{s2} = 0.8$ μm, H=3 μm, d=5.0 nm, and $\epsilon_2 = 3.9$, Equation (1) yields 15 fF per cell capacitor.

When cells in the above-described form are arranged geometrically so that each of them is aligned with the adjacent cells in both the vertical and horizontal directions as shown in FIG. 11, the parasitic capacitance $C_{p4}$ is expressed by $$C_{p4} = \epsilon_0 \times \epsilon_1 \times L_{s2} \times H \div T_{s1} \qquad \text{Eq. (2)}$$

where $\epsilon_1$ is a relative dielectric constant of the interlayer insulating film and $T_{s1}$ is the distance between the cell capacitors A and B. Substitution of $T_{s1} = 0.08$ μm into Equation (2) yields the parasitic capacitance $C_{p4}$ of about 0.8 fF. This value reaches as much as 5.3% (calculated by 0.8÷15× 100) of the set cell capacitance value (15 fF).

Figure 13:
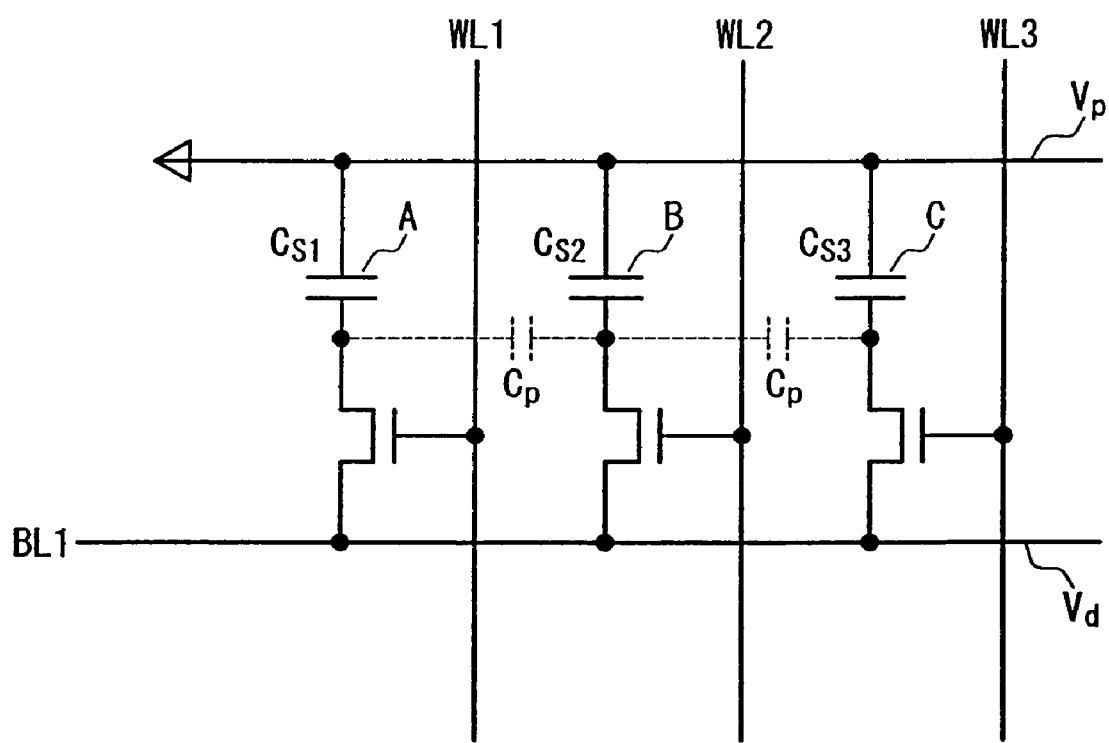
FIG. 13 is an equivalent circuit diagram showing the configuration of a storage capacity element portion (i.e., a DRAM circuit) in a semiconductor memory device.

The operation of memory cells when the parasitic capacitance value is not less than 5% of the cell capacitance value will be described with reference to FIG. 13. For example, when data of logic level "High" is written onto the cell capacitor B while the cell capacitors A and B have been in the logic level "Low" state, i.e., in the discharge state, the word line WL2 is activated to apply a voltage $V_d$ that is supplied as the potential of a bit line BL1. At this time, a potential difference $V_p - V_d$ between the voltage $V_p$ of the plate electrode and the step-up voltage $V_d$ (i.e. the potential of BL1) is applied to the cell capacitor B, so that charge is accumulated.

However, in the case where the parasitic capacitance $C_{p4}$ is present between the cell capacitors A and B and between the cell capacitors C and B, the cell capacitors A and C are connected in parallel when viewed from the cell capacitor B. As is generally known, the capacitance of the parallel-connected capacitors is determined by adding their capacitances. In this case, the capacitance of $2C_{p4} = C_{p4} + C_{p4}$ is connected in series with the cell capacitor B.

When the cell capacitors A and C are in the logic level "Low" state, the potential difference is applied under the condition that the parasitic capacitance $2C_{p4}$ is connected in series with the cell capacitance $C_{s2}$ of the cell capacitor B. Assuming that the parasitic capacitance $C_{p4}$ is 5% of the cell capacitance $C_{s2}$, the potential applied to a target cell causes 5% loss compared with the original potential to be applied. When another cell capacitor in the same logic state is present in the opposite direction to the target cell, the potential causes as much as 10% loss in total.

In general cell structure design, a margin for an applied voltage and an operating voltage is set to a maximum of 10%. When the parasitic capacitance is more than 10%, it exceeds the set margin. Consequently, writing operation cannot be ensured. Therefore, both the expected charge retention amount and charge retention time as the basic performance of memory cells cannot be ensured due to the parasitic capacitance.

Even when data is read out of a cell capacitor in the charge retention state, the cell capacitor is recognized as to be in the discharge state because the potential difference for reading has been lowered by the parasitic capacitance.

As shown in FIG. 1, when the adjacent cell capacitors are staggered so that only a part of a side face of one cell capacitor is opposite to that of the other instead of arranging them to be opposite completely to each other like the conventional layout, the parasitic capacitance $C_{p1}$ is expressed by $$C_{p1} = \epsilon_0 \times \epsilon_1 \times L_d \times H \div T_{s1} \qquad \text{Eq. (3)}$$

where $L_d$ is the length of a portion where the opposing cell capacitors are overlapped. Substitution of $L_d=0.6$ μm into Equation (3) yields $C_{p1}=0.6$ fF, which is 4% (calculated by $0.6 \div 15 \times 100$) of the set cell capacitance value (15 fF).

In the pattern layout of this embodiment, the adjacent cell capacitors are not opposite completely, but are opposite partially to each other. Thus, a difference in the parasitic capacitance between the layout of this embodiment and that of the conventional example is given by $$\Delta C_{p1} = C_{p4} - C_{p1}, \qquad \text{Eq. (4)}$$

showing that the parasitic capacitance can be reduced by 1.3%. The above equations (1) to (4) are used to calculate only the capacitance between adjacent cells, which exerts the greatest effect on the parasitic capacitance, and ignores the parasitic capacitance effected by other cells.

This embodiment can reduce the parasitic capacitance between adjacent cell capacitors by providing the cell layout as described above, even if the cell size and the capacitor size are the same as those of a conventional example.

It is preferable that the length $L_d$ of a portion where the opposing capacitors are overlapped in the mask layout is set so that the value of the parasitic capacitance between adjacent cell capacitors is not more than 10% of the set cell capacitance value. This is because malfunction occurs remarkably when the parasitic capacitance is more than 10% of the set capacitance.

The above method makes it possible to reduce the parasitic capacitance between adjacent cell capacitors and suppress malfunction caused by noise without changing the conventional capacitor shape, capacitance, or the like.

Second Embodiment

A second embodiment of the present invention devices the shape of a cell capacitor, which will be described with reference to FIG. 3.

Figure 3:
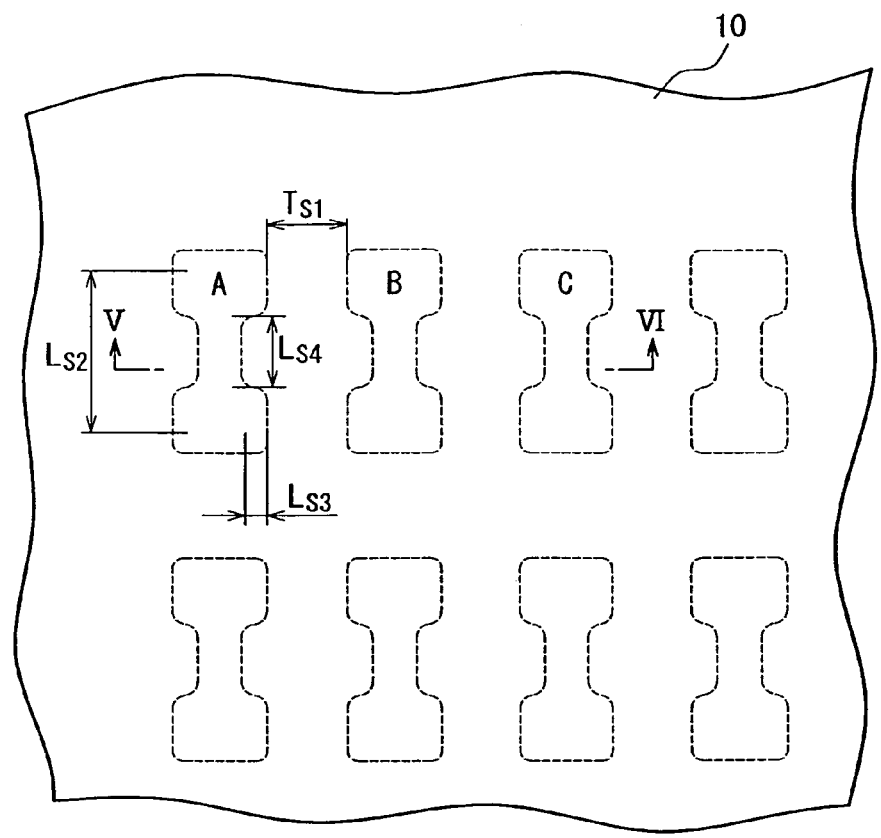
FIG. 3 is a plan view schematically showing the layout of cell capacitors in a semiconductor memory device of a second embodiment of the present invention.

FIG. 3 is a plan view schematically showing the layout of cell capacitors in a semiconductor memory device of this embodiment. Each cell capacitor is not simply rectangular, but has such a shape that the central portions of its long sides are recessed, and the distance between those central portions of the respective side faces of the opposing cells is larger.

In FIG. 3, reference numeral 10 denotes a plate electrode, $L_{s2}$ denotes the long side length of a cell capacitor, $L_{s3}$ denotes the length of a recessed portion in the short side direction of the cell capacitor, $L_{s4}$ denotes the length of the recessed portion in the long side direction of the cell capacitor, and $T_{s1}$ denotes the minimum distance between the adjacent cell capacitors.

Figure 4:
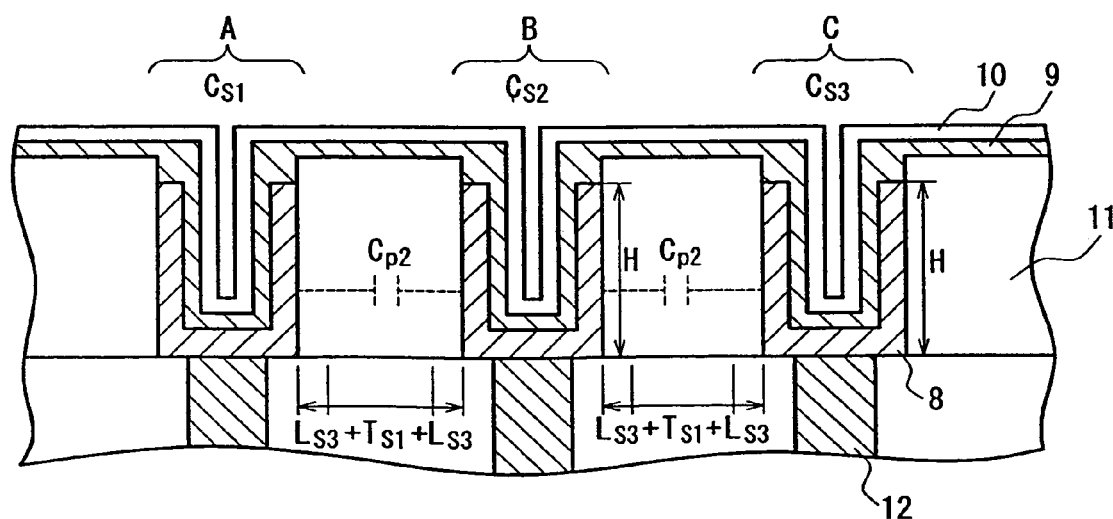
FIG. 4 is a cross-sectional view showing the structure of the cell capacitors, taken along the line V-VI in FIG. 3.

FIG. 4 is a cross-sectional view showing the structure of the cell capacitors, taken along the line V-VI in FIG. 3. As shown in FIG. 4, the width of the interlayer insulating film between the cell capacitors is decreased partially. In FIG. 4, reference numeral 11 denotes an interlayer insulating film, 8 denotes storage nodes, 9 denotes a capacitor insulating film, 10 denotes a plate electrode, and 12 denotes plugs.

When the cell capacitors have the shape illustrated in FIGS. 3 and 4, the distance between the recessed portions of the cell capacitors is given by $L_{s3}+T_{s1}+L_{s3}$. This makes the distance between the central portions of the opposing cell capacitors larger. Therefore, even if the cell capacitors are arranged orderly in both the vertical and horizontal directions so that the side face of one cell capacitor is opposite completely to that of the other like the conventional cell capacitors, the parasitic capacitance can be reduced as a whole.

When each of adjacent cell capacitors has recessed portions in the central portions of its long sides in the direction in which the parasitic capacitance value is increased, the parasitic capacitance $C_{p2}$ is expressed by $$C_{p2} = \epsilon_0 \times \epsilon_1 \times \{(L_{s2}-L_{s4}) \times H \div T_{s1} + (L_{s4} \times H \div (L_{s3}+T_{s1}+L_{s3}))\} \qquad \text{Eq. (5)}$$

where $L_{s3}$ is the length of the recessed portion in the short side direction and $L_{s4}$ is the length of the recessed portion in the long side direction. In this case, a difference in the parasitic capacitance that is generated between cells having no recessed portion and between cells having recessed portions is given by $$\Delta C_{p2} = C_{p4} - C_{p2}. \qquad \text{Eq. (6)}$$

When $L_{s2}=0.8$ μm, $H=3$ μm, $T_{s1}=0.08$ μm, $L_{s3}=0.03$ μm and $L_{s4}=0.4$ μm, $\Delta C_{p2}$ is 0.57 fF. This is 3.8% (calculated by $0.57 \div 15 \times 100$) of the individual set cell capacitance value (15 fF). Here, the values of $L_{s2}$, H and $T_{s1}$ are the same as those in the first embodiment. Accordingly, the parasitic capacitance, which is generated between a target capacitor and the capacitor adjacent to one side of the target capacitor, can be reduced by 1.5% in terms of the ratio of the set cell capacitance, compared with the conventional example (5.3%).

In this embodiment, each cell capacitor is provided with recessed portions having straight sides and square corners so as to increase the distance between the central portions of the opposing side faces. However, the same effect can be obtained by recessed portions having a curved shape with a curvature.

This embodiment can reduce the parasitic capacitance between adjacent cell capacitors by forming the cells as described above, even if the cell layout is the same as that of a conventional example.

It is preferable that the cell shape is modified so that the value of the parasitic capacitance between adjacent cell capacitors is not more than 10% of the set cell capacitance value. This is because malfunction occurs remarkably when the parasitic capacitance is more than 10% of the set capacitance.

The above method also makes it possible to reduce the parasitic capacitance between adjacent cell capacitors and suppress malfunction caused by noise without changing the conventional cell layout, capacitance, or the like.

Third Embodiment

A third embodiment of the present invention reduces the parasitic capacitance in such a manner that a concavity is formed in the upper portion of an interlayer insulating film between cell capacitors and a plate electrode is buried in the concavity.

This embodiment will be described with reference to FIG. 5. FIG. 5 is a cross-sectional view showing the structure of memory cell capacitors in a semiconductor memory device of this embodiment. In the planar layout, these cell capacitors are arranged in the same manner as that of the conventional example shown in FIG. 11. However, they are different from the conventional example in the cross-sectional structure taken along the line I-II in FIG. 11.

The structure shown in FIG. 5 is the same as that of the conventional example in that storage nodes 8 and a capacitor insulating film 9 are buried in the trenches formed in an interlayer insulating film 11. This embodiment is different from the conventional example in that a plate electrode 20 is buried in concavities (20a and 20b) provided between the cell capacitors.

When the plate electrode 20 is buried in the concavity between the cell capacitors, the potential in the region between the adjacent cell capacitors where the plate electrode is buried is fixed due to the buried plate electrode. Therefore, the parasitic capacitance is not generated in the region where the plate electrode is buried. In other words, the parasitic capacitance is reduced by the height D of the concavity from the height of the cell. The parasitic capacitance $C_{p3}$ in this case is estimated by $$C_{p3} = \epsilon_0 \times \epsilon_1 \times L_{s2} \times (H-D) \div T_{s1} \qquad \text{Eq. (7)}$$

where D is the depth of the concavity in which the plate electrode 20 is buried, $T_{s1}$ is the distance between adjacent cell capacitors, $L_{s2}$ is the long side length of the cell capacitor, and H is the height of the cell capacitor (see FIG. 11).

Compared with the conventional example, the parasitic capacitance can be reduced by $$\Delta C_{p3} = \epsilon_0 \times \epsilon_1 \times L_{s2} \times D \div T_{s1}. \qquad \text{Eq. (8)}$$

When the specific values in the first embodiment are used and the depth D of the concavity in which the plate electrode 20 is buried is 0.5 μm, $$\Delta C_{p3} = 0.62 \text{ fF} \qquad \text{Eq. (9)}$$

is obtained. This is 4.1% of the individual set cell capacitance value (15 fF). Accordingly, the parasitic capacitance, which is generated between a target capacitor and the capacitor adjacent to one side of the target capacitor, can be reduced by about 1.2% in terms of the ratio of the set cell capacitance, compared with the conventional example (5.3%). In other words, this embodiment makes it possible to reduce the parasitic capacitance between adjacent cell capacitors and suppress malfunction caused by noise, even if the desired cell size and capacitor size are set.

It is preferable that the depth D of the concavity in which the plate electrode 20 is buried is set so that the value of the parasitic capacitance between adjacent cell capacitors is not more than 10% of the set cell capacitance value.

Fourth Embodiment

The following is an explanation of a fourth embodiment of the present invention, concerning a method for manufacturing the semiconductor memory device of the first embodiment.

Figure 6A:
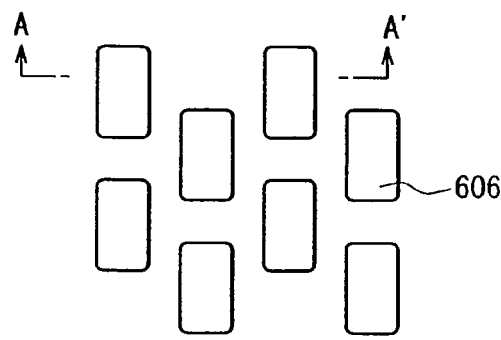
FIG. 6A is a plan view showing the layout of a mask pattern for storage nodes according to a method for manufacturing a semiconductor memory device of a fourth embodiment of the present invention.
Figure 6B:
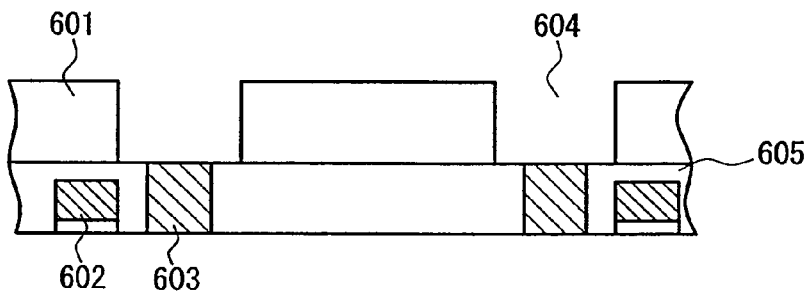
FIG. 6B is a cross-sectional view showing a step of manufacturing cell capacitors according to the method of the fourth embodiment of the present invention.
Figure 6C:
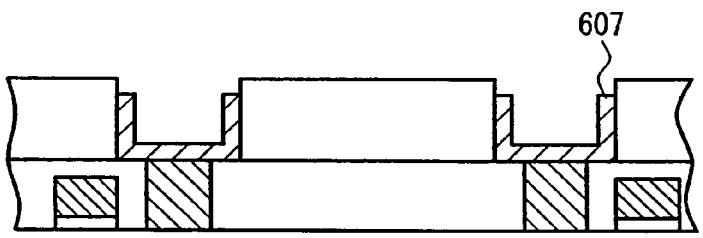
FIG. 6C is a cross-sectional view showing a step of manufacturing the cell capacitors according to the method of the fourth embodiment of the. present invention.
Figure 6D:
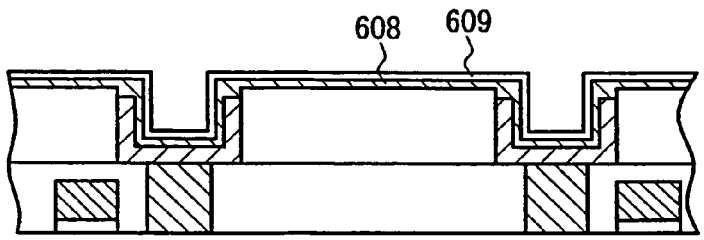
FIG. 6D is a cross-sectional view showing a step of manufacturing the cell capacitors according to the method of the fourth embodiment of the present invention.

FIG. 6A is a plan view showing the layout of a mask pattern for storage nodes according to the method of this embodiment. FIGS. 6B to 6D are cross-sectional views showing the steps of manufacturing cell capacitors according to the method of this embodiment. Here, FIGS. 6C and 6D are the cross-sectional views taken along the line A-A' in FIG. 6A.

First, as shown in FIG. 6B, transfer gate MOS transistors 602 are formed on the regions of a semiconductor substrate where storage capacity elements are formed, on which a silicon oxide film is deposited as a first interlayer insulating film 605, and then contact plugs 603 for connecting. storage nodes to the substrate are formed. Thereafter, a second interlayer insulating film 601, e.g., a BPSG film (which is a silicon oxide film including 1-4% B (boron) and 4-8% P (phosphorus)) is deposited in a thickness of about 1 μm. A silicon oxide film or silicon nitride film may be formed on the bottom or the top of the BPSG film to be a laminated film, though this is not shown in FIG. 6B.

Next, a resist is applied and a storage node pattern of the cell capacitor array is patterned by lithography. As the mask pattern for this process, a mask pattern 606 for storage nodes having the layout shown in FIG. 6A is used. Then, anisotropic dry etching is performed to form holes 604 for storage nodes in the second interlayer insulating film 601.

As shown in FIG. 6C, a film for forming storage nodes, e.g., a silicon film including P (phosphorus) with a concentration of $1E20/cm^3$ as impurities is deposited on the entire substrate. Then, only the silicon film on the second interlayer insulating film 601 is removed selectively by, e.g., dry etching. Consequently, storage nodes 607 are formed in the holes 604.

Next, as shown in FIG. 6D, a capacitor insulating film 608, e.g., an ON film (which is a laminated film of a silicon oxide film and a silicon nitride film) is deposited, and a plate electrode 609, e.g., a silicon film including P (phosphorus) with a concentration of $2E20/cm^3$ as impurities is deposited, followed by lithography and dry etching to form a plate electrode pattern.

The storage nodes 607 formed by the above manufacturing method are arranged in accordance with the layout of the mask pattern 606. This layout can provide the characteristics of the first embodiment. That is, the parasitic capacitance between adjacent cell capacitors can be reduced by providing the cell layout as described above, even if the cell size and the capacitor size are the same as those of a conventional example.

It is preferable that the length $L_d$ of a portion where the opposing capacitors are overlapped in the mask layout is set so that the value of the parasitic capacitance between adjacent cell capacitors is not more than 10% of the set cell capacitance value. This is because malfunction occurs remarkably when the parasitic capacitance is more than 10% of the set capacitance.

Fifth Embodiment

The following is an explanation of a fifth embodiment of the present invention, concerning a method for manufacturing the semiconductor memory device of the second embodiment.

Figure 7A:
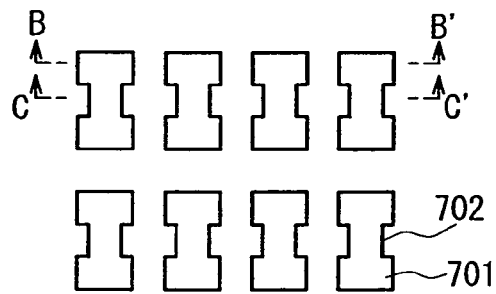
FIG. 7A is a plan view showing the layout of a mask pattern for storage nodes according to a method for manufacturing a semiconductor memory device of a fifth embodiment of the present invention.

FIG. 7A is a plan view showing the layout of a mask pattern for storage nodes according to the method of this embodiment. FIGS. 7B to 7E are cross-sectional views showing the steps of manufacturing cell capacitors according to the method of this embodiment. Here, FIGS. 7B to 7E are the cross-sectional views taken along the line B-B' in FIG. 7A.

Figure 7B:
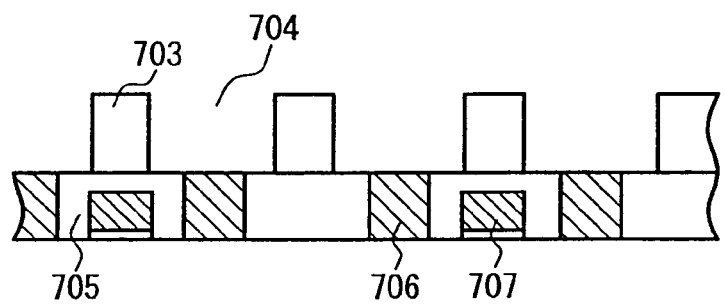
FIG. 7B is a cross-sectional view showing a step of manufacturing cell capacitors according to the method of the fifth embodiment of the present invention.

First, as shown in FIG. 7B, transfer gate MOS transistors 707 are formed on the regions of a semiconductor substrate where storage capacity elements are formed, on which a silicon oxide film is deposited as a first interlayer insulating film 705, and then contact plugs 706 for connecting storage nodes to the substrate are formed. Thereafter, a second interlayer insulating film 703, e.g., a BPSG film is deposited in a thickness of about 1 µm. A silicon oxide film or silicon nitride film may be formed on the bottom or the top of the BPSG film to be a laminated film, though this is not shown in FIG. 7B.

Next, a resist is applied and a storage node pattern of the cell capacitor array is patterned by lithography. As the mask pattern for this process, a mask pattern 701 for storage nodes having the layout shown in FIG. 7A is used. In the mask pattern, each storage node has recessed portions 702 in the central portions of its long sides opposed to the adjacent storage nodes. Then, anisotropic dry etching is performed to form holes 704 for storage nodes in the second interlayer insulating film 703.

Figure 7C:
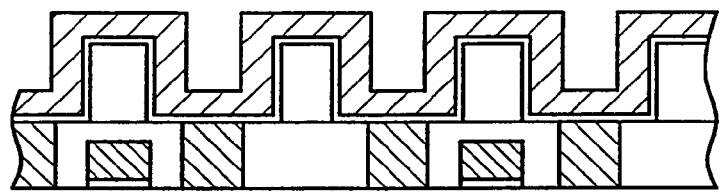
FIG. 7C is a cross-sectional view showing a step of manufacturing the cell capacitors according to the method of the fifth embodiment of the present invention.

As shown in FIG. 7C, a film for forming storage nodes, e.g., a silicon film including P (phosphorus) with a concentration of $1E20/cm^3$ as impurities is deposited on the entire substrate.

Figure 7D:
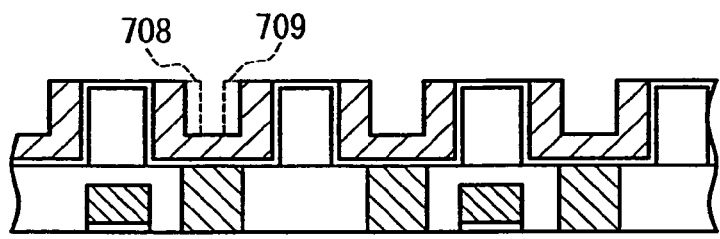
FIG. 7D is a cross-sectional view showing a step of manufacturing the cell capacitors according to the method of the fifth embodiment of the present invention.
Figure 7E:
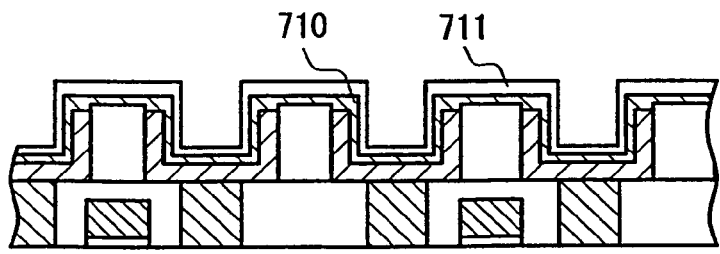
FIG. 7E is a cross-sectional view showing a step of manufacturing the cell capacitors according to the method of the fifth embodiment of the present invention.

Then, as shown in FIG. 7D, only the silicon film on the second interlayer insulating film 703 is removed selectively by, e.g., dry etching. Consequently, storage nodes 709 are formed in the holes 704. Each of the storage nodes 709 has recessed portions 708, which are present in the cross-sectional structure taken along the line C-C' in FIG. 7A Next, as shown in FIG. 7E, a capacitor insulating film 710, e.g., an ON film (which is a laminated film of a silicon oxide film and a silicon nitride film) is deposited, and a plate electrode 711, e.g., a silicon film including P (phosphorus) with a concentration of $2E20/cm^3$ as impurities is deposited, followed by lithography and dry etching to form a plate electrode pattern.

The storage nodes 709 formed by the above manufacturing method are arranged in accordance with the layout of the mask pattern 701. This layout can provide the characteristics of the second embodiment. That is, the parasitic capacitance between adjacent cell capacitors can be reduced by forming the cells as described above, even if the cell layout is the same as that of a conventional example.

It is preferable that the cell shape is modified so that the value of the parasitic capacitance between adjacent cell capacitors is not more than 10% of the set cell capacitance value. This is because malfunction occurs remarkably when the parasitic capacitance is more than 10% of the set capacitance.

The above method also makes it possible to reduce the parasitic capacitance between adjacent cell capacitors and suppress malfunction caused by noise without changing the conventional cell layout, capacitance, or the like.

In the patterning for forming storage nodes by lithography, the proximity effect can be enhanced by using, e.g., a resist with high resolution even when a mask pattern 801 for storage nodes having the layout shown in FIG. 8, which is the same as that of a conventional layout, is used as the mask pattern. Thus, the portions of each storage node pattern that correspond to the corners thereof are affected by the adjacent patterns and thus increased in size. Consequently, the opposing portions of the adjacent patterns can be recessed, providing the same effect as that of this embodiment.

FIG. 9 is a graph showing a hole size in the corner of a pattern resulting from proximity effect versus a hole array pitch P when a hole mask diameter L is 0.23 µm in FIG. 8. As shown in FIG. 9, when the hole array pitch P is smaller than 0.55 µm, the proximity effect is enhanced to make the hole size larger.

Sixth Embodiment

The following is an explanation of a sixth embodiment of the present invention, concerning a method for manufacturing the semiconductor memory device of the third embodiment.

Figure 10A:
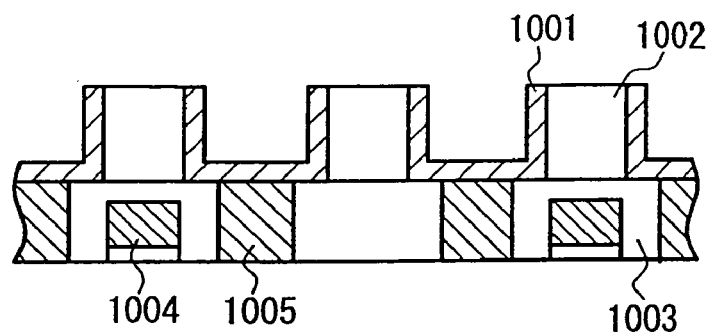
FIG. 10A is a cross-sectional view showing a manufacturing step of cell capacitors according to a method for manufacturing a semiconductor memory device of a sixth embodiment of the present invention.
Figure 10B:
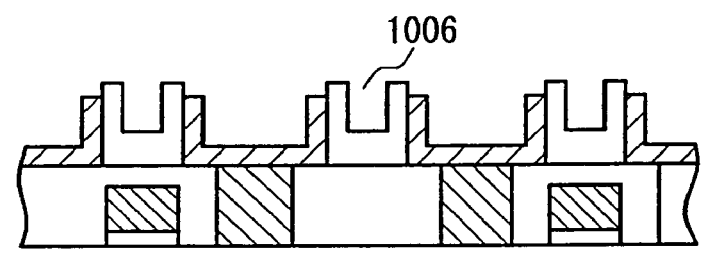
FIG. 10B is a cross-sectional view showing a step of manufacturing the cell capacitors according to the method of the sixth embodiment of the present invention.
Figure 10C:
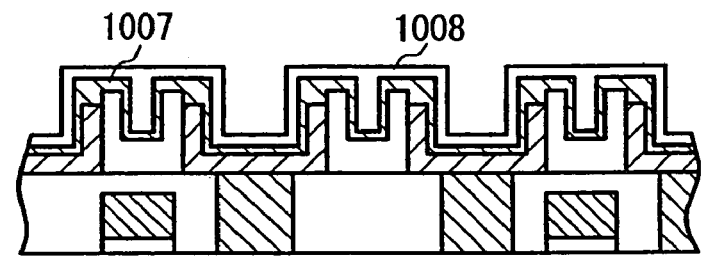
FIG. 10C is a cross-sectional view showing a step of manufacturing the cell capacitors according to the method of the sixth embodiment of the present invention.

FIGS. 10A to 10C are cross-sectional views showing the steps of manufacturing cell capacitors according to the method of this embodiment.

First, as shown in FIG. 10A, transfer gate MOS transistors 1004 are formed on the regions of a semiconductor substrate where storage capacity elements are formed, on which a silicon oxide film is deposited as a first interlayer insulating film 1003, and then contact plugs 1005 for connecting storage nodes to the substrate are formed. Thereafter, a second interlayer insulating film 1002, e.g., a BPSG film is deposited in a thickness of about 1 µm. A silicon oxide film or silicon nitride film may be formed on the bottom or the top of the BPSG film to be a laminated film, though this is not shown in FIG. 10A.

Next, a resist is applied and a storage node pattern of the cell capacitor array is patterned by lithography. As the mask pattern for this process, a mask pattern 801 for storage nodes having the layout shown in FIG. 8 is used. Then, anisotropic dry etching is performed to form holes for storage nodes in the second interlayer insulating film 1002.

Next, a film for forming storage nodes, e.g., a silicon film including P (phosphorus) with a concentration of $1E20/cm^3$ as impurities is deposited on the entire substrate. Then, only the silicon film on the second interlayer insulating film 1002 is removed selectively by, e.g., dry etching that ensures a selection ratio for etching silicon in preference to the oxide film. Consequently, cylindrical storage nodes 1001 are formed in the holes.

As shown in FIG. 10B, a concavity 1006 is formed in such a manner that the upper portion of the second interlayer insulating film 1002 located between the storage nodes 1001 is removed by dry etching that ensures a selection ratio for etching the oxide film in preference to silicon.

Next, as shown in FIG. 10C, a capacitor insulating film 1007, e.g., an ON film (which is. a laminated film of a silicon oxide film and a silicon nitride film) is deposited, and a plate electrode 1008, e.g., a silicon film including P (phosphorus) with a concentration of $2E20/cm^3$ as impurities is deposited, followed by lithography and dry etching to form a plate electrode pattern.

The cross-sectional structure of the storage nodes formed by the above manufacturing method is the same as that of the third embodiment shown in FIG. 5. This makes it possible to reduce the parasitic capacitance between adjacent cell capacitors and suppress malfunction caused by noise, even if the desired cell size and capacitor size are set.

Moreover, when both steps of selective dry etching of silicon for forming the storage nodes and dry etching of the upper portion of the second interlayer insulating film 1002 are performed in the same apparatus by changing gas species, the steps also can be shortened.

It is preferable that the depth of the concavity in which the plate electrode 1008 is buried is set so that the value of the parasitic capacitance between adjacent cell capacitors is not more than 10% of the set cell capacitance value. This makes it possible to reduce the parasitic capacitance between adjacent cell capacitors and suppress malfunction caused by noise without changing the conventional capacitor shape, capacitance, or the like.

The same effect can be obtained when the concavities 1006 are formed in the following manner: the selective removal of silicon that serves as a film for forming storage nodes is performed by CMP (chemical machining polishing), and then a chemical solution including, e.g., HF is used in the cleaning process for removing the CMP slurry, so that the silicon of the storage nodes is not shaved while only the upper portion of the second interlayer insulating film 1002 is etched.

OTHER EMBODIMENTS

As described above, for the trench-type stacked structure, in which cell capacitors are formed without removing an interlayer insulating film, the parasitic capacitance is multiplied by a relative dielectric constant $\epsilon_1$ of the interlayer insulating film as a proportional constant. To reduce the parasitic capacitance, it is particularly effective for the trench-type stacked cell capacitor structure to use a film having a lower dielectric constant than that of a silicon oxide film as the interlayer insulating film between cell capacitors instead of the silicon oxide film.

When the interlayer insulating film is a silicon oxide film (BPSG film) that includes 1-4% B (boron) and 4-8% P (phosphorus), the relative dielectric constant $\epsilon_1$ is about 3.9. By using a so-called low dielectric constant film as the interlayer insulating film, the parasitic capacitance can be reduced proportionally.

For example, when the interlayer insulating film is a silicon oxide film that includes F (fluorine) such as fluorosilicate glass (FSG), the relative dielectric constant is about 3.5. In this case, the parasitic capacitance value can be reduced by 3.5/3.9 times compared with the BPSG film.

In addition to the silicon oxide film including F, examples of the low dielectric constant film that can be applied to the present invention include SiC, $SiC_xH_yO_z$ (0<x<1, 0<y<1, and 0<z<2), an amorphous carbon film, other organic films and the like.

When the method of this embodiment is used alone, it is preferable to use the interlayer insulating film having a relative dielectric constant that allows the capacitance between adjacent cell capacitors to be not more than 10% of the accumulated charge capacitance for each capacitor, specifically, a relative dielectric constant of 3.5 or less. This is because malfunction tends to occur when the relative dielectric constant of the interlayer insulating film is more than 10%.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor memory device comprising:

depositing an interlayer insulating film on a semiconductor substrate provided with contact plugs;

patterning a mask pattern on the interlayer insulating film, the mask pattern having a layout in which a plurality of hole patterns having the same shape are arranged so that the adjacent hole patterns are only partially opposite to each other;

forming holes for storage nodes in the interlayer insulating film by etching with the mask pattern;

forming storage nodes in the holes so as to be connected electrically to the contact plugs;

forming a capacitor insulating film on the storage nodes; and forming a plate electrode on the capacitor insulating film, wherein the length of a portion where the opposing capacitors are overlapped in the mask pattern is set so that the value of the parasitic capacitance between adjacent cell capacitors is not more than 10% of the set cell capacitance value; and wherein the interlayer insulating film is made of at least one selected from the group consisting of SiC, $SiC_xH_yO_z$ (0<x<1, 0<y<1, and 0<z<2), and amorphous carbon.

2. The method according to claim 1, wherein the interlayer insulating film is made of SiC.

3. The method according to claim 1, wherein the interlayer insulating film is made of $SiC_xH_yO_z$ (0<x<1, 0<y<1, and 0<z<2).

4. The method according to claim 1, wherein the interlayer insulating film is made of an amorphous carbon.

* * * * *